United States Patent
Arai

(10) Patent No.: US 8,248,162 B2
(45) Date of Patent: Aug. 21, 2012

(54) DIFFERENTIAL AMPLIFIER

(75) Inventor: Mitsuru Arai, Kyoto (JP)

(73) Assignee: OKI Semiconductor Co., Ltd., Tokyo (JP)

(*) Notice: Subject to any disclaimer, the term of this patent is extended or adjusted under 35 U.S.C. 154(b) by 11 days.

(21) Appl. No.: 12/902,178

(22) Filed: Oct. 12, 2010

(65) Prior Publication Data
US 2011/0102085 A1 May 5, 2011

(30) Foreign Application Priority Data

Nov. 2, 2009 (JP) ................................. 2009-252146

(51) Int. Cl.
*H03F 3/45* (2006.01)

(52) U.S. Cl. .......................................... 330/253; 330/9

(58) Field of Classification Search .......... 330/252–261, 330/9, 51
See application file for complete search history.

(56) References Cited

U.S. PATENT DOCUMENTS
7,525,383 B2 * 4/2009 Kobayashi et al. ........... 330/261

FOREIGN PATENT DOCUMENTS
JP 04-192619 10/1992
* cited by examiner

*Primary Examiner* — Hieu Nguyen
(74) *Attorney, Agent, or Firm* — Volentine & Whitt, PLLC

(57) ABSTRACT

A high-gain differential amplifier that is capable of high speed operation, outputs a signal representing a difference between signals respectively inputted to first and second input terminals and a phase-inverted signal thereof via first and second output terminals respectively. A first switching element making a short-circuit between the first input terminal and the second output terminal when turned on, a second switching element making a short-circuit between the second input terminal and the first output terminal when turned on, and a third switching element making a short-circuit between the first output terminal and the second output terminal when turned on are provided. The third switching element is turned on for a predetermined period while the first and second switching elements are turned off. Subsequently, the third switching element is switched off, and the first and second switching elements are switched on.

4 Claims, 3 Drawing Sheets

DIFFERENTIAL AMPLIFIER

BACKGROUND OF THE INVENTION

1. Field of the Invention

The present invention relates to a differential amplifier that outputs a signal corresponding to a level difference between two input signals.

2. Description of the Related Art

Differential amplifiers of CMOS (Complementary Metal Oxide Semiconductor) structure having a current mirror circuit are known as an example of the differential amplifier described above. A differential amplifier of this type is for example shown in FIG. 2 of Japanese Patent Kokai No. H04-192619 (Patent Literature 1). In such a differential amplifier, analog input signals S1 and S2 are respectively inputted to the gate of each of n-channel MOS transistors 1 and 2. Consequently, a current corresponding to the input signal S1 flows into the re-channel MOS transistor 1 via a p-channel MOS transistor 3 that constitutes a current mirror circuit. At the same time, a current corresponding to the input signal S2 flows into the n-channel MOS transistor 2 via a p-channel MOS transistor 4 that constitutes the current mirror circuit.

In this case, a differential output signal corresponding to a level difference between the input signals S1 and S2 is obtained at a connection point between the n-channel MOS transistor 2 and the p-channel MOS transistor 3.

With respect to a differential amplifier constituting an operational amplifier, it is desirable that, immediately before the supply of the input signals to be differentially amplified, the input and output voltages are stabilized in the form of self-bias voltages of the operational amplifier. This is beneficial for obtaining an accurate output result.

However, when a large amplitude analog signal is inputted or when the sampling intervals are long in the case that a high-gain circuit is employed as the current mirror circuit of the differential amplifier, the output of the operational amplifier can be saturated and the MOS transistor constituting the current mirror circuit can operate in a linear region. As a result, when the differential amplifier is rendered to operate in such a state, a relatively long time is necessary to shift the operation region of the MOS transistor from the linear region to a saturation region even if the input and output terminals of the differential amplifier are short-circuited, and consequently a problem of a reduced processing speed will result.

SUMMARY OF THE INVENTION

The present invention has been made to solve the problem described above and it is an object of the present invention to provide a differential amplifier that has a high-gain and is able to perform a high-speed operation.

According to the embodiment, there is provided a differential amplifier that outputs a difference signal representing a difference between signals respectively inputted to first and second input terminals via a first output terminal and outputs an inverted difference signal, inverted in phase, of said difference signal via a second output terminal, comprising a first switching element that makes a short-circuit between said first input terminal and said second output terminal when turned on, a second switching element that makes a short-circuit between said second input terminal and said first output terminal when turned on, a third switching element that makes a short-circuit between said first output terminal and said second output terminal when turned on, and a control part that performs an output short-circuiting step of setting the third switching element to an ON state for a predetermined period while setting said first and second switching elements to an OFF state, and subsequently performs an initializing step of switching said third switching element to the OFF state and switching both of said first and second switching elements to the ON state.

In the embodiment, when making a short-circuit between the input and output terminals of a differential amplifier in order to stabilize input and output voltages of the differential amplifier as an operational amplifier into a state of a self-bias voltage of the operational amplifier, the output terminals outputting signals inverted in phase with each other are short-circuited for a predetermined period immediately before the short-circuiting between the input and output terminals.

As a result of this procedure, even when a load transistor of the differential amplifier is operating in a linear region upon receipt of a large-amplitude signal, it is possible to immediately put back the operation of the transistor to a saturated region. Accordingly, when the input and output terminals of the differential amplifier are short-circuited subsequently, both of the input and output voltages becomes equal to the self-bias voltage of the operational amplifier in a short time. Thus, according to the embodiment, it is possible to realize high-speed operation of a high-gain differential amplifier in which the operation state of a load transistor tend to shift to a linear region when a high-amplitude signal is inputted.

EMBODIMENT OF THE INVENTION

In a differential amplifier that outputs a difference signal representing a difference between signals respectively inputted to first and second input terminals via a first output terminal and outputs an inverted difference signal, inverted in phase, of said difference signal via a second output terminal, a first switching element that makes a short-circuit between said first input terminal and said second output terminal when turned on, a second switching element that makes a short-circuit between said second input terminal and said first output terminal when turned on, and a third switching element that makes a short-circuit between said first output terminal and said second output terminal when turned on are provided. With this configuration, the third switching element is set to an ON state for a predetermined period while setting said first and second switching elements are set to an OFF state, and subsequently the third switching element is switched to the OFF state and both of said first and second switching elements are switched to the ON state. Through these steps, the input and output voltages of the differential amplifier rapidly reach to the self-bias voltage of the operational amplifier.

Figure 1:
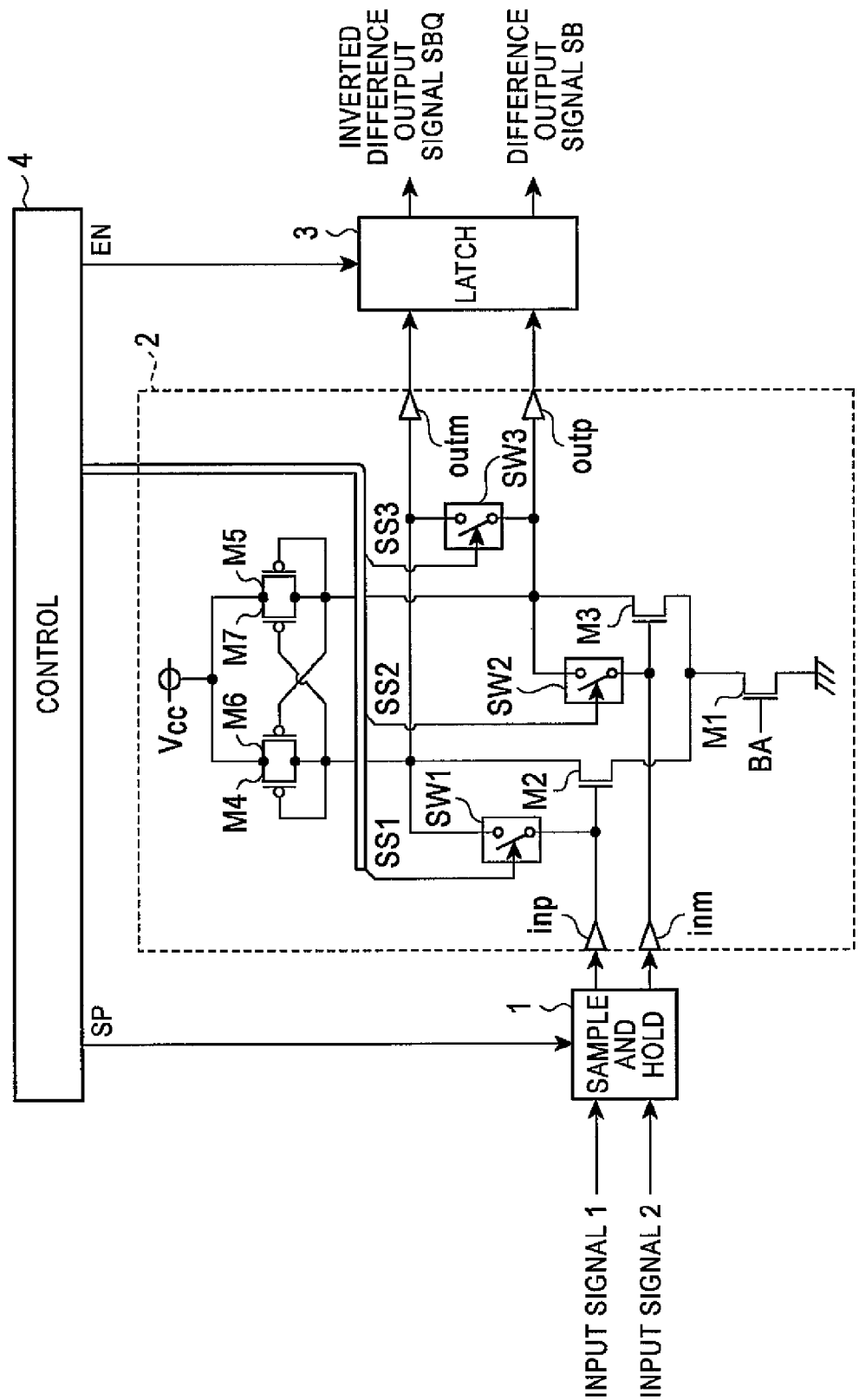
FIG. 1 is a configuration diagram of an embodiment of the differential amplifier according to the present invention.

FIG. 1 is a configuration diagram of an embodiment of the differential amplifier according to the present invention.

As shown in FIG. 1, the differential amplifier is constituted by a sample and hold part 1, a differential amplifier circuit serving as a main body of the differential amplifier, a latch part 3 and a control part 4.

Figure 2:
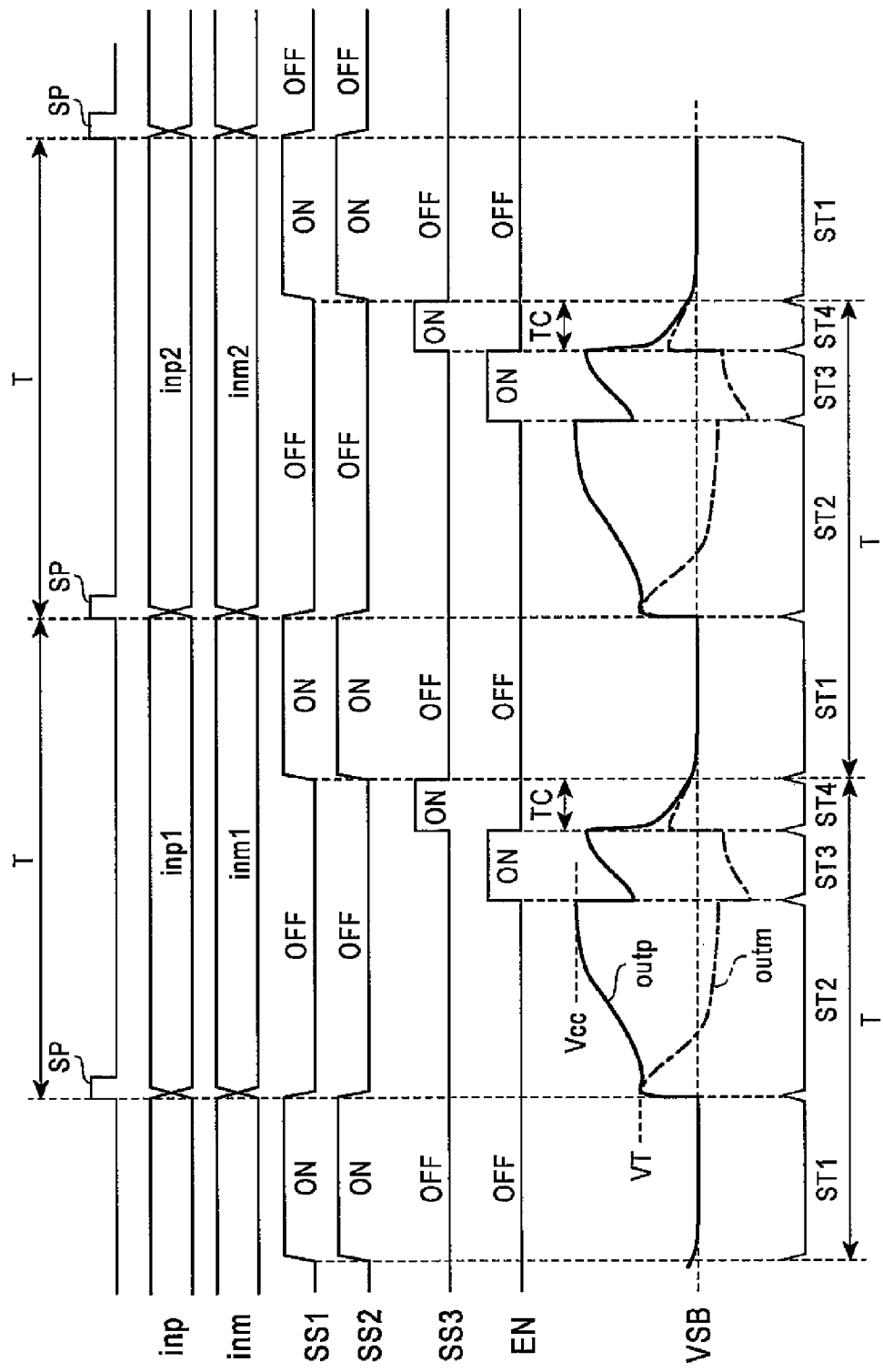
FIG. 2 is a time-chart showing control operations by a control part 4.

The sample and hold part 1 takes a first input signal S1 and a second input signal S2 in accordance with a sampling pulse signal SP supplied from a control part 4 and supplies the input signals respectively to an input terminal inp and an input terminal inm of a differential amplifier circuit 2. As depicted in FIG. 2, the control part 4 supplies the sampling pulse signal SP to the sample and hold part 1 at predetermined sampling intervals T.

The differential amplifier circuit 2 comprises transistors M1-M3 as n-channel MOS transistors, transistors M4-M7 as p-channel MOS transistors, switches SW1-SW3, two input terminals inp and inm, and two output terminals outp and outm. The source terminal of the transistor M1 is grounded and a predetermined bias voltage BA is applied to the gate terminal of the transistor M1.

To the drain terminal of the transistor M1, the source terminals of the transistors M2 and M3 are respectively connected. To the gate terminal of the transistor M2, the input signal S1 transmitted from the sample and hold part 1 is supplied via the input terminal inp.

To the drain terminal of the transistor M2, the source terminals of the transistors M4 and M6, and the gate terminal of the transistor M4 and the gate terminal of the transistor M7 and the output terminal outm are commonly connected. The input signal S2 transmitted from the sample and hold part is supplied to the gate terminal of the transistor M3 via the input terminal inm. The source terminals of the transistors M5 and M7, the gate terminal of the transistor M5, the gate terminal of the transistor M6 and the output terminal outp are commonly connected to the drain terminal of the transistor M3. A predetermined power voltage Vcc is supplied to the drain terminal of each of the transistors M4 to M7. In the structure described above, a current corresponding to the input signal S1 supplied through the input terminal inp flows into the transistor M2 via the transistors M4 and M6 as load transistors. Additionally, a current corresponding to the input signal S2 supplied through the input terminal inm flows into the transistor M3 via the transistors M5 and M7 as load transistors. In this instance, a signal having a level corresponding to a difference between the input signal S1 and S2 appears at the output terminal outp, and this signal is supplied to the latch part 3 as a difference output signal. Similarly, a phase inverted signal of the above described difference output signal appears at the output terminal outm, and is supplied to the latch part 3 as the inverted difference output signal. The differential amplifier circuit 2 is further provided with a switching element SW1 as a means for short-circuiting between the input terminal inp and the output terminal outm, a switching element SW2 as a means for short-circuiting between the input terminal inm and the output terminal outp, and a switching element SW3 as a means for short-circuiting between the output terminal outm and the output terminal outp. The switching element SW1 turns to the ON state in response to the switch signal SS1 supplied from the control part 4, thereby causing a short-circuit between the input terminal inp and output terminal outm, and the switching element SW2 turns to the ON state in response to the switch signal SS2 supplied from the control part 4, thereby causing a short-circuit between the input terminal inm and output terminal outp. The switching element SW3 turns to the ON state in response to the switch signal SS3 supplied from the control part 4, thereby causing a short-circuit between the output terminal outm and output terminal outp.

Only in a period in which a latch enable signal EN is supplied from the control part 4, the latch part 3 takes the difference output signal supplied via the above-described output terminal outp, and outputs it as the difference output signal SB, and takes the inverted difference output signal supplied via the above-described output terminal outm, and outputs it as the inverted difference output signal SBQ, The control part 4 controls the operation of the differential amplifier by supplying the above described sampling pulse SP, latch enable signal EN and switch signals SS1 to SS3 to the sample and hold part 1, the differential amplifier circuit 2 and the latch part 3 in the manner shown in FIG. 2. In this procedure, the control part 4 sequentially performs an initializing step ST1, a differential amplifying step ST2, an output latch step ST3 and an output short-circuiting step ST4 in each of the intervals which is the same as the sampling interval T of the sampling pulse SP.

More specifically, the control part 4 first supplies the switch signal SS3 for setting the OFF state (logical LOW level of the switch signal SS3) to the switching element SW3, and also supplies the switch signals SS1 and SS2 for setting the ON state (logical HI level of the switch signals SS1 and SS2) to the switching elements SW1 and SW2 (initializing step ST1). By this control, short-circuit between the input terminal inp and the output terminal outm and short-circuit between the input terminal inm and the output terminal outp are created. As a result, the signal levels at the output terminals outm and outp are both converged to the self bias voltage VSB of the operational amplifier, as shown in FIG. 2.

After the execution of the initialization step ST1, the control part 4 supplies the switch signals SS1 and SS2 for causing a transition to the OFF state (logical low level of the switch signals SS1 and SS2) to the switching elements SW1 and SW2, and also supplies the sampling pulse SP to the sample and hold part 1. In response to the sampling pulse SP, the sample and hold part 1 retains the input signals S1 and S2 that are the inputs to be processed by the differential amplification, and supplies the signals to the input terminals inp and inm of the differential amplifier circuit 2 respectively. Consequently, a current corresponding to the level of the input signal S1 flows into the transistor M2 via the drain terminal and source terminal of each of the transistors M4 and M6 of the differential amplifier circuit 2, and a current corresponding to the level of the input signal S2 flows into the transistor M3 via the drain terminal and source terminal of each of the transistors M5 and M7 of the differential amplifier circuit 2.

As a result, the voltage at the connection point of the source terminals of the transistor M5 and M7 and the drain terminal of the transistor M3, that is, the level of the output terminal outp becomes equal to a voltage VT corresponding to a level difference between the input signals S1 and S2, as depicted in FIG. 2. In the differential amplifier circuit 2 shown in FIG. 1, however, a positive feedback loop circuit consisting of the transistor M6 and M7 is added to the load transistors M4 and M5 in order to obtain a high gain. Therefor, if the levels of the input signals are high, the level at the output terminal outp, i.e., the level of the difference output signal gradually rises from the voltage VT and reach to the power source voltage Vcc is illustrated in FIG. 2. In this state, the transistor M5 is caused to operate in a linear region instead of operating in a saturated region which is originally intended. The level at the other output terminal outm, that is, the level of the inverted difference output signal decreases as the level at the output terminal outp rises, as depicted in FIG. 2.

The control part 4 then supplies the latch enable signal EN for respectively latching the difference signal and the inverted difference signal at the output terminals outp and outm to the latch part 3 in the output latch step ST3. In response to the latch enable signal EN, the latch part 3 retains the difference signal and the inverted reference signal transmitted through the output terminals outn and outp of the differential amplifier circuit, and supplies each signal as the difference output signal SB and the inverted difference output signal SBQ.

The control part 4 then supplies the switch signal SS3 for setting the switching element SW3 of the differential amplifier circuit 2 to the ON state for a predetermined period TC, to the switching element SW3 (output short-circuiting step ST4) as depicted in FIG. 2. In response to the switch signal SS3, the switching element SW3 makes a short-circuit between the output terminals outp and outm only for the above-described period TC. As a result, the levels at the output terminals outp and outm respectively are rapidly shifts towards the self bias voltage VSB of the operational amplifier as depicted in FIG. 2. Thus, the transistor M5 which has been operating in the linear region quickly returns to the operating state in the saturated region.

As shown in FIG. 2, the control part 4 repeatedly executes the series of control procedures consisting of the above-described initializing step ST1, the differential amplifying step ST2, output latch step ST3, and the output short-circuiting step ST4 in each of the sampling periods T.

As described above, the output short-circuiting step ST4 is executed after the execution of the output-latch step ST3 in which the results obtained by the differential amplification are retained by the latch part 3, before moving to the next initializing step ST1. That is, before executing the short-circuiting between the input terminal inp and the output terminal outm and between the input terminal inm and the output terminal outp (at ST1), the output terminals outp and outm are once short-circuited (at step ST4).

As shown in FIG. 2, by the output short-circuiting step ST4, even if the state that the voltage at the output terminal outp of the differential amplifier circuit 2 reaches to the power supply voltage Vcc occurs in the differential amplifying step ST2, that is, even if the state that the transistor M5 (M4) of the differential amplifier circuit 2 operates in the linear region occurs in the differential amplifying step ST2, it is possible to decrease the voltage swiftly, so that the operational state of the transistor M5 returns to the saturated region. With this feature, the period spent for the initializing step ST1, i.e, the period in which the input and output voltages of the differential amplifier circuit 2 are stabilized in the state of the self bias voltage as the operational amplifier and become ready for the next input, is shortened as compared with a case that the output short-circuiting step ST 4 is not executed.

Figure 3A:
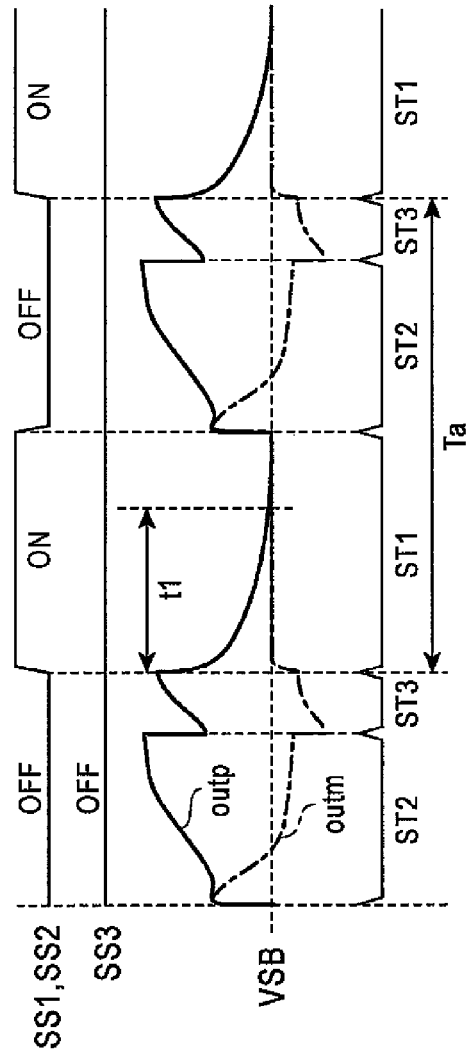
FIGS. 3A and 3B are comparison diagrams showing a difference between transitions of the voltage at the output terminal outp when the output short-circuiting step ST4 is executed and unexecuted, respectively.
Figure 3B:
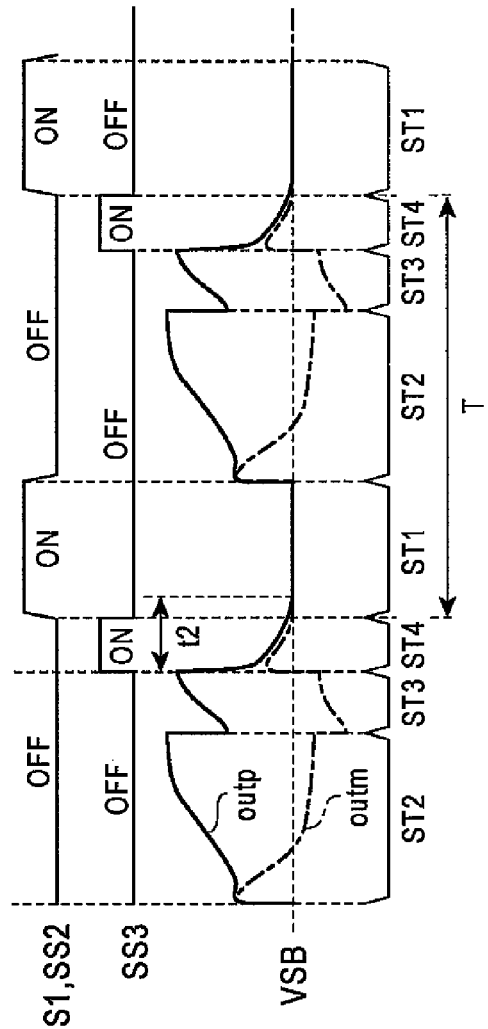

For example, if the above-described output short-circuiting step ST4 is omitted, the process will proceed to the initializing step ST1 immediately after the execution of the output latch step ST3, as illustrated in FIG. 3A. However, if the operational state of the load transistors (M4, M5) is in a linear region immediately before the initializing step ST1, the voltage at the output terminal outp will not be reduced rapidly even if short-circuit between the input terminal inp and output terminal outm and the short-circuit between the input terminal inm and output terminal outp are made. Accordingly, the period t1 in the initializing step ST1 shown FIG. 3A in which the voltage at the output terminal outp reaches to the self bias voltage VSB becomes longer than the period t2 in the output short-circuiting step ST4 and the initializing step ST1 in which the voltage at the output terminal outp reaches to the self-bias voltage VSB when the output short-circuiting step ST4 shown is executed as shown in FIG. 3B.

As a result, the sampling period T in the case that the output short-circuiting step ST4 is executed after the initializing step ST1, the differential amplifying step ST2, and the output latch step ST3 will become, in consequence, shorter than the sampling period Ta in the case shown in FIG. 3A in which the output short-circuiting step ST4 is not executed.

Stated another way, a high speed operation is enabled in a high-gain differential amplifier by short-circuiting the output terminals (outm, outp) for respectively taking out the differential output results which are inverted in phase to each other, immediately before the initializing step ST1.

In the embodiment described above, a differential amplifier circuit in which a positive feedback loop circuit consisting of transistors M6 and M7 is added to the load transistors M4 and M7 to obtain a high gain is adopted as the differential amplifier circuit 2. However, it is needless to mention that the structure of the differential amplifier circuit is not limited to this example.

According to the present invention, in a high gain differential amplifier in which the operation state of the load transistor will shift from the saturated region to the linear region upon receipt of a large amplitude input signals, a switching element SW3 for short circuiting the output terminals (outm, outp) immediately before the execution of the initializing step ST1, is provided. A high-speed operation of the differential amplifier is thus realized.

This application is based on Japanese Patent Application No. 2009-252146 which is herein incorporated by reference.

What is claimed is:

1. A differential amplifier that outputs a difference signal representing a difference between signals respectively inputted to first and second input terminals via a first output terminal, and that outputs an inverted difference signal that corresponds to said difference signal inverted in phase via a second output terminal, comprising:
   a first switching element that makes a short-circuit between said first input terminal and said second output terminal when turned on,
   a second switching element that makes a short-circuit between said second input terminal and said first output terminal when turned on,
   a third switching element that makes a short-circuit between said first output terminal and said second output terminal when turned on, and
   a control part that performs an output short-circuiting step of setting the third switching element to an ON state for a predetermined period while setting said first and second switching elements to an OFF state, and subsequently performs an initializing step of simultaneously switching said third switching element to the OFF state from the ON state and both of said first and second switching elements to the ON state from the OFF state.

2. A differential amplifier as claimed in claim 1, further comprising:
   a sample and hold part that supplies input signals respectively to said first and second input terminals at predetermined sampling intervals, wherein said control part controls said sample and hold part to supply each of said input signals to said first and second input terminals after execution of said initializing step.

3. A differential amplifier that outputs a difference signal representing a difference between signals respectively inputted to first and second input terminals via a first output terminal, and that outputs an inverted difference signal that corresponds to said difference signal inverted in phase via a second output terminal, comprising:
   a first switching element that makes a short-circuit between said first input terminal and said second output terminal when turned on,
   a second switching element that makes a short-circuit between said second input terminal and said first output terminal when turned on, a third switching element that makes a short-circuit between said first output terminal and said second output terminal when turned on,
a control part that performs an output short-circuiting step of setting the third switching element to an ON state for a predetermined period while setting said first and second switching elements to an OFF state, and subsequently performs an initializing step of switching said third switching element to the OFF state and switching both of said first and second switching elements to the ON state, and
a latch part that retains and outputs a signal on said first output terminal as said difference signal and retains and outputs a signal on said second output terminal as said inverted difference signal in accordance with a latch-enable signal, wherein said control part supplies said latch enable signal to said latch part immediately before said output short-circuiting step.

4. A differential amplifier as claimed in claim 3, further comprising:
a sample and hold part that supplies input signals respectively to said first and second input terminals at predetermined sampling intervals, wherein said control part controls said sample and hold part to supply each of said input signals to said first and second input terminals after execution of said initializing step.

* * * * *